(12) United States Patent
Hause et al.

(10) Patent No.: US 6,261,908 B1
(45) Date of Patent: Jul. 17, 2001

(54) BURIED LOCAL INTERCONNECT

(75) Inventors: Frederick N. Hause, Austin; Mark I. Gardner, Cedar Creek; Charles E. May, Austin, all of TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/123,177

(22) Filed: Jul. 27, 1998

(51) Int. Cl.[7] .................................................. H01L 21/336
(52) U.S. Cl. ......................... 438/280; 438/214; 438/618; 438/621; 438/666; 438/669
(58) Field of Search ..................... 438/424, 427, 438/430–432, 453, 598, 599, 618, 637, 639, 640, 673, 248, 243, 280, 214, 621, 666, 669; 257/301

(56) References Cited

U.S. PATENT DOCUMENTS

| 4,683,486 | 7/1987 | Chatterjee ........................... 357/23.6 |
| 5,070,388 | 12/1991 | Wade et al. .............................. 357/68 |
| 5,100,823 * | 3/1992 | Yamada ................................. 438/243 |
| 5,268,326 * | 12/1993 | Lesk et al. ............................. 438/406 |
| 5,274,965 * | 1/1994 | Manning ............................... 438/430 |
| 5,275,965 * | 1/1994 | Manning ............................... 438/430 |
| 5,283,461 | 2/1994 | Beasom ................................. 257/508 |
| 5,349,218 * | 9/1994 | Tadaki et al. ......................... 257/296 |
| 5,552,620 | 9/1996 | Lu et al. ................................ 257/302 |
| 5,627,092 * | 5/1997 | Alsmeier et al. ..................... 438/152 |
| 5,672,537 * | 9/1997 | Carl et al. ............................. 438/386 |
| 5,702,969 * | 12/1997 | Lee ........................................ 438/239 |
| 5,770,876 | 6/1998 | Lam et al. ............................ 257/301 |
| 5,798,545 | 8/1998 | Iwasa et al. ......................... 257/301 |
| 5,859,466 | 1/1999 | Wada ................................... 257/508 |
| 6,020,230 * | 2/2000 | Wu ....................................... 438/222 |

OTHER PUBLICATIONS

IBM, "Single–Crystal Silicon Embedded With Insulated Conducting Wires"; IBM Technical Disclosure Bulletin; vol. 32; No. 3B; Aug. 1989; pp. 403–407.
Stanley Wolf and Richard N. Tauber; *Silicon Processing for the VLSI Era, vol. 2–Process Integration*; pp. 160–169; 1990.

* cited by examiner

Primary Examiner—Stephen D. Meier
Assistant Examiner—Christy L. Novacek
(74) Attorney, Agent, or Firm—Timothy M. Honeycutt

(57) ABSTRACT

A method of fabricating a buried local interconnect in a substrate and an integrated circuit incorporating the same are provided. The method includes the steps forming a trench in the substrate and forming a first insulating layer in the trench. A conductor layer is formed on the first insulating layer. A portion of the conductor layer is removed to define a local interconnect layer and a second insulating layer is formed in the trench covering the local interconnect layer. The method provides for a local interconnect layer buried beneath a dielectric layer of an integrated circuit, such as a shallow trench isolation layer. Areas of a substrate above the silicon-silicon dioxide interface formerly reserved for local interconnect layers in conventional processing may now be used for additional conductor lines.

15 Claims, 4 Drawing Sheets

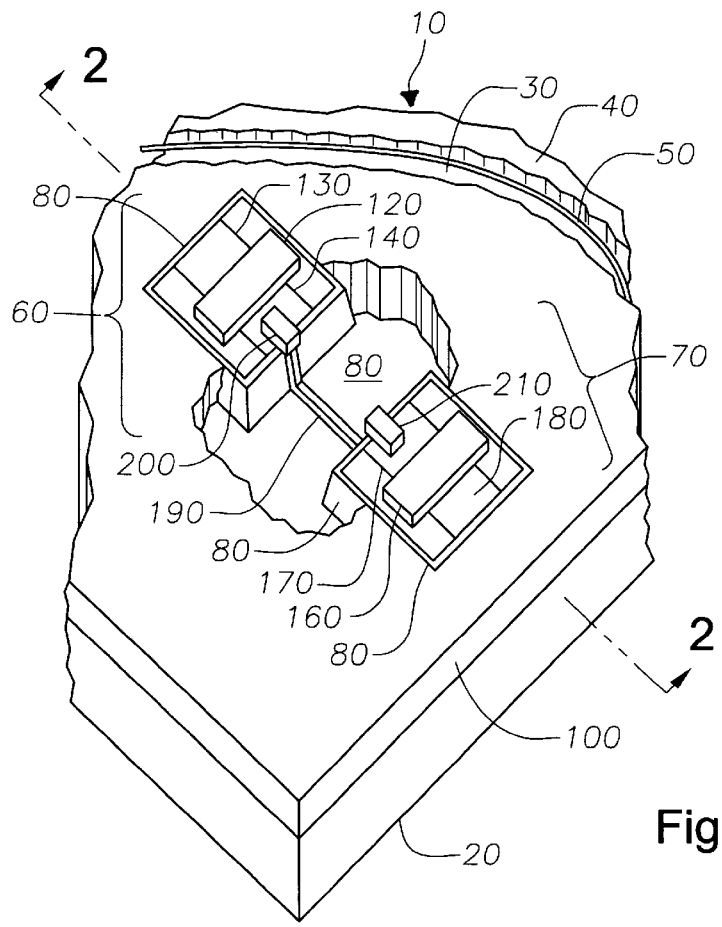
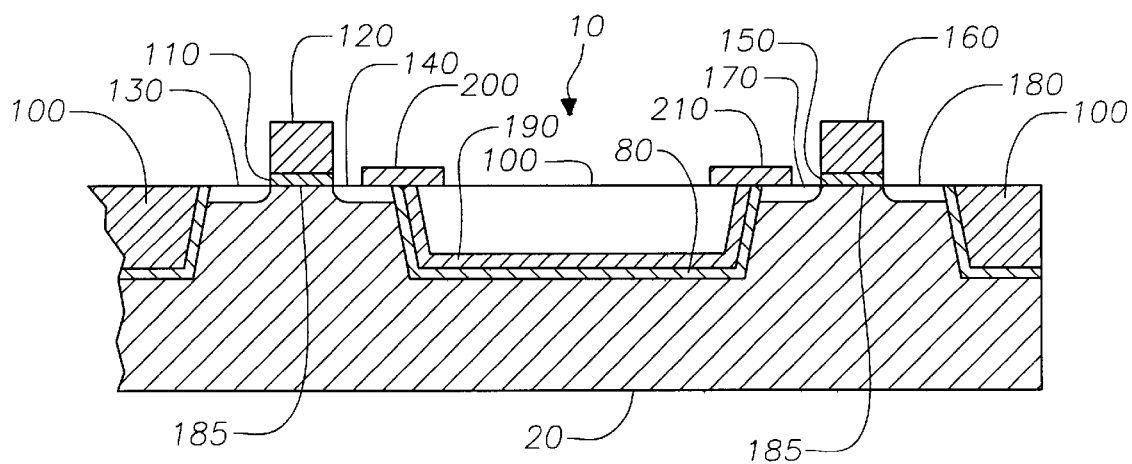

BURIED LOCAL INTERCONNECT

BACKGROUND OF THE INVENTION

1. Field of the Invention

This invention relates generally to semiconductor processing, and more particularly, to a buried local interconnect structure for connecting components of an integrated circuit, and to a method of making the same.

2. Description of the Related Art

Modem integrated circuits routinely contain millions of individual transistors and other electronic components. Most of the interconnections for the numerous components in such circuits are provided via one or more metallization layers that serve as global interconnect levels. Each metallization layer is ordinarily deposited on the substrate of the integrated circuit as a single continuous layer that is thereafter patterned lithographically and etched to remove metal from areas where metal lines are not required.

In addition to the one or more metallization layers, modem integrated circuits also incorporate numerous routing restricted interconnect levels commonly known as local interconnects ("LI"). LIs are used for short conductor runs such as those that locally interconnect gates and drains in NMOS and CMOS circuits and those that connect a given metallization layer to a particular structure in the integrated circuit.

A conventional method frequently employed to form LI structures involves a damascene process in which the substrate containing the integrated circuit is coated with a layer of dielectric material, such as a silicon dioxide or tetrathyl-ortho-silicate ("TEOS") passivation layer. The passivation layer is lithographically patterned and etched to form trenches where the LI structures will be deposited. In another conventional processing technique, local interconnects are formed on the substrate prior to application of a passivation layer. A feature common to both conventional techniques is the disposition of the local interconnect layers at or above the silicon-silicon dioxide interface.

As with many other modem semiconductor processing techniques, there are tradeoffs associated with implementing local interconnect layers. LI's provide a vital tool for VLSI and ULSI circuit designers. The ability to pattern pluralities of short conductor runs has enabled designers to save significant chip-area in integrated circuit layouts. At the same time, each local interconnect layer formed above the silicon-silicon dioxide interface in a give integrated circuit represents a potential restriction on the routing of other conductor lines, and thus the packing density, for the circuit.

The problem of routing restriction is more complex when doped polysilicon is used as the local interconnect material. Doped polysilicon is often selected for local interconnect layers as a result of thermal budgeting or other design considerations. The poly is commonly used as both a gate material and local interconnect material. As a result, when the polysilicon layer functions as an interconnect structure, it cannot cross over regions where a transistor gate exists without making contact to the gate. Unless such contacts with the gates are desired, gate locations represent areas on the substrate that cannot be crossed by polysilicon layers where these layers are being used as local interconnect layers.

Various techniques to overcome the polysilicon routing restrictions have been implemented in the past. Some of these include selectively forming $TiSi_2$ to form an LI level, sputter-depositing titanium-tungsten over $CoSi_2$ contacts, forming a titanium nitride layer over a $TiSi_2$ contact, and forming a dual-doped polysilicon LI with diffused source/drain junctions. While these techniques alleviate some of the routing difficulties associated with polysilicon local interconnect layers, they also increase processing steps and complexity. Furthermore, cluttering of the substrate area above the silicon-silicon dioxide interface remains a problem.

The present invention is directed to overcoming or reducing one or more of the foregoing disadvantages.

SUMMARY OF THE INVENTION

In accordance with one aspect of the present invention, a method of fabricating a buried local interconnect on a substrate is provided. The method includes the steps forming a trench in the substrate and forming a first insulating layer in the trench. The trench has a bottom wall and opposing sidewalls. A conductor layer is formed on the first insulating layer. A portion of the conductor layer is removed to define a local interconnect layer while the first insulating layer continues to cover the bottom wall. A second insulating layer is formed in the trench covering the local interconnect layer.

In accordance with another aspect of the present invention, a method of fabricating a buried local interconnect on a substrate is provided. The method includes the steps of forming a trench in the substrate, forming a first insulating layer in the trench and applying a mask to the first insulating layer. The mask is patterned to expose a portion of the first insulating layer. A conductor layer is formed on the exposed portion of the first insulating layer. The mask is removed and a second insulating layer is formed in the trench covering the conductor layer.

In accordance with still another aspect of the present invention, a method of fabricating a buried local interconnect in a substrate is provided. The method includes the steps of forming a trench in the substrate where the trench has a bottom wall, a first sidewall and a second sidewall, and forming a first insulating layer in the trench. A conductor layer is formed on the first insulating layer. A portion of the conductor layer is removed while the first insulating layer continues to cover the bottom wall to define a local interconnect layer extending from the first sidewall to the second sidewall. A second insulating layer is formed in the trench covering the local interconnect layer.

In accordance with another aspect of the present invention, a method of fabricating a buried local interconnect in a substrate is provided. The method includes the steps of forming a trench in the substrate, forming a first insulating layer in the trench and applying a mask to the first insulating layer. The mask is patterned to expose a portion of the first insulating layer. A conductor layer is formed on the exposed portion of the first insulating layer. The mask is removed and a second insulating layer is formed in the trench covering the conductor layer.

In accordance with still another aspect of the present invention, a method of fabricating a buried local interconnect in a substrate is provided. The method includes the steps of forming a trench in the substrate where the trench has a first sidewall and a second sidewall, and forming a first insulating layer in the trench. A conductor layer is formed on the first insulating layer. A portion of the conductor layer is removed to define a local interconnect layer extending from the first sidewall to the second sidewall. A second insulating layer is formed in the trench covering the local interconnect layer.

In accordance with another aspect of the present invention, an integrated circuit is provided. The integrated circuit includes a substrate that has a trench formed therein. First and second electronic circuits are formed on the substrate and are physically spaced apart by the trench. A first insulating layer is formed in the trench. A second insulating layer is formed on the first insulating layer. A local interconnect layer is formed on the first insulating layer and beneath the second insulating layer. The local interconnect layer is connected between the first and second electronic circuits.

BRIEF DESCRIPTION OF THE DRAWINGS

The foregoing and other advantages of the invention will become apparent upon reading the following detailed description and upon reference to the drawings in which:

FIG. 1 is a pictorial view of an exemplary embodiment of an integrated circuit incorporating a buried local interconnect in accordance with the present invention;

FIG. 2 is a cross-sectional view of FIG. 1 taken at section 2—2;

DETAILED DESCRIPTION OF SPECIFIC EMBODIMENTS

Figure 3:
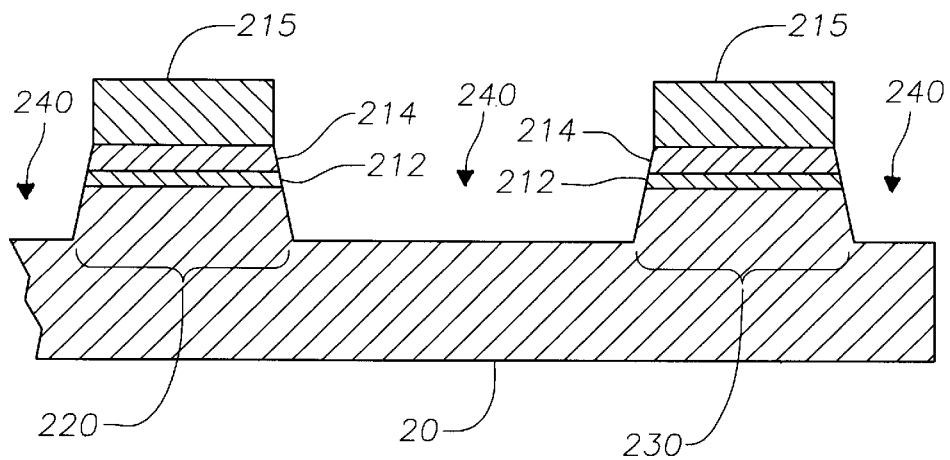
FIG. 3 is a cross-sectional view like FIG. 2 depicting formation of a trench in a substrate in accordance with the present invention.

In the drawings described below, reference numerals are generally repeated where identical elements appear in more than one figure. Turning now to the drawings, and in particular to FIGS. 1 and 2, there is shown a pictorial view and a cross-sectional view of an exemplary embodiment of an integrated circuit 10 that includes a substrate 20, two or more interlevel dielectric layers 30 and 40, and at least one metallization layer 50 sandwiched between the interlevel dielectric layers 30 and 40. The layers 30, 40, and 50 are not shown in FIG. 2. The metallization layer 50 serves as a global interconnect layer to provide interconnection for the various components in the integrated circuit 10. The interlevel dielectric layers 30 and 40 and the metallization layer 50 have been peeled away to reveal electronic components 60 and 70. Although the integrated circuit 10 may contain many components, for simplicity of illustration, only two components 60 and 70 are shown. For the purpose of this illustration, the components 60 and 70 are depicted as field effect transistors. However, the components may be transistors, capacitors, or any of a variety of different types of electronic components implemented in integrated circuits.

The transistors 60 and 70 are electrically isolated by a first insulating layer or liner 80, and by a layer of shallow trench isolation ("STI") material 100. The transistor 60 includes a gate dielectric layer 110 formed on the substrate 20 and a gate electrode 120 formed on the gate dielectric layer 110. Source/drain regions 130 and 140 are formed laterally and self-aligned to the gate electrode 120 in the substrate 20. The phrase "source/drain region(s)" is used herein to describe a region that may serve as either a source or a drain. The skilled artisan will appreciate that a source/drain region may function as a source or a drain depending upon whether it is connected to $V_{SS}$ or $V_{DD}$ during metallization. In like fashion, the transistor 70 includes a gate electrode stack consisting of a gate dielectric layer 150 formed on the substrate 20 and a gate electrode 160 formed on the gate dielectric layer 150. Source/drain regions 170 and 180 are formed in the substrate 20 laterally and self-aligned to the gate electrode 160. The silicon-silicon dioxide interface for the substrate 20 is designated generally at 185.

A portion of the STI layer 100 has been cut away in FIG. 1 to reveal a buried local interconnect 190 that provides electrical connection between the source/drain region 140 of the transistor 60 and the source/drain region 170 of the transistor 70. Electrical connection between the buried local interconnect 190 and the respective source/drain regions 140 and 170 is established by local interconnect straps 200 and 210. The particular interconnection is illustrative as the buried local interconnect could be used to connect a myriad of different structures.

An exemplary process flow for forming the buried local interconnect 190 depicted in FIGS. 1 and 2 may be understood by referring now to FIGS. 3, 4, 5, 6, 7, and 8 and initially to FIG. 3. Initially, the substrate 20 is provided with a pad oxide layer 212 and a $Si_3N_4$ layer 214 formed on the pad oxide layer 212. The pad oxide layer 212 may have a thickness of about 50 to 200 Å and advantageously about 100 Å, and is advantageously formed by thermal oxidation in a rapid thermal anneal ("RTA") process at about 800 to 1100° C. for about 5 to 20 seconds or other suitable process. The $Si_3N_4$ layer 214 may be formed by chemical vapor deposition ("CVD") or other suitable nitride application technique and may have a thickness of about 1000 to 2000 Å, and advantageously about 1200 Å. The pad oxide layer 212 and the $Si_3N_4$ layer 214 are designed to protect the substrate 20 from contamination and damage during subsequent processing.

The substrate 20 is masked with photoresist 215 or other suitable masking material, and the photoresist is patterned, that is, exposed and developed to define active regions 220 and 230 where the transistors 60 and 70 will be respectively formed during subsequent processing. The substrate 20 may be composed of n-doped or p-doped silicon, silicon-on-insulator, or other suitable substrate materials. After the photoresist 215 has been patterned, a trench 240 is formed in the substrate 20, advantageously by reactive ion etching, plasma etching, or other suitable anisotropic removal techniques. The etch process may be tailored to establish tapered sidewall profiles for the trench 240 as shown in FIG. 3 or substantially a vertical profiles as desired. In this exemplary process flow, the trench 240 is formed essentially as a moat-like structure around the active areas 220 and 230 to provide space for deposition of the STI layer 100 depicted in FIGS. 1 and 2 during subsequent processing. However, the trench 240 may alternatively be formed as a more localized void in the substrate 20 that stretches from one active area of the substrate to another. The depth of the trench 240 is largely a matter of design discretion. In an exemplary embodiment, the trench 240 has a depth of about 3000 to 4000 Å. Following formation of the trench 240, the photoresist 215 is stripped.

Figure 4:
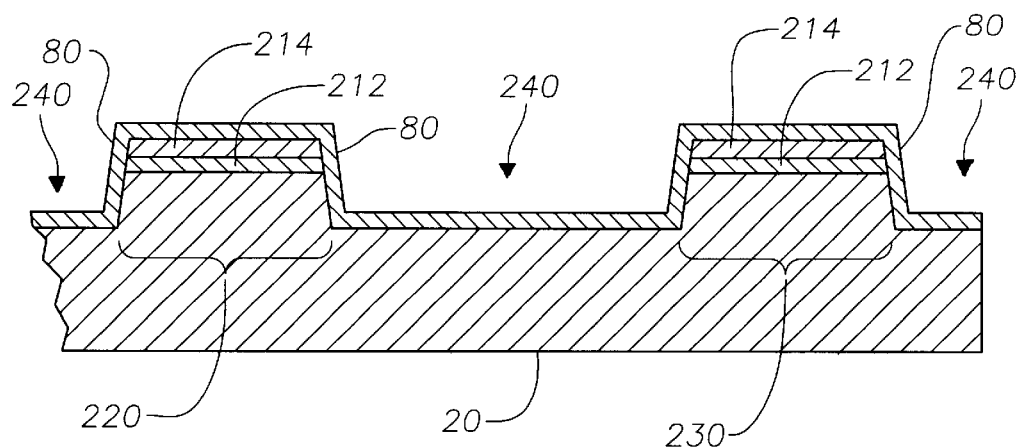
FIG. 4 is a cross-sectional view like FIG. 3 depicting formation of a first insulating layer in the trench in accordance with the present invention.

Referring now to FIG. 4, the first insulating layer 80 is formed in the trench 240 so that the bottom as well as the sidewalls of the trench 240 are covered with an insulating material. The liner layer 80 is designed to protect the underlying substrate 25 from contamination and/or structural damage during subsequent processing. Accordingly, the liner layer 80 may be composed of silicon dioxide, silicon nitride, or like materials. If silicon dioxide is selected, the layer 80 may be fabricated by dry oxidation of the substrate 20. In an exemplary process, the substrate 20 is exposed to an $O_2$ containing ambient at about 800 to about 1150° C for between about 5 and 20 minutes. A suitable RTA process or CVD may also be used. If a silicon dioxidesilicon nitride mix is selected, CVD may be used. The layer 80 may be about 100 to 1000 Å thick and is advantageously about 500 Å thick.

Figure 5:
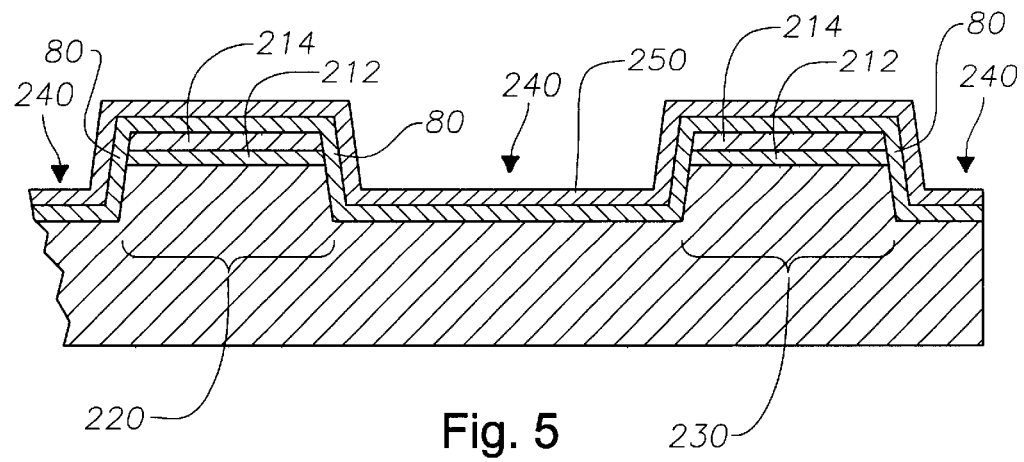
FIG. 5 is a cross-sectional view like FIG. 4 depicting formation of a conductor layer on the first insulating layer in accordance with the present invention.

Referring now to FIG. 5, a conductor layer 250 is formed on the first insulating layer 80. The conductor layer 250 will be subsequently processed to define the buried local interconnect 190 depicted in FIGS. 1 and 2. Accordingly, the conductor layer 250 may be advantageously composed of a variety of conducting materials, such as doped polysilicon, aluminum, copper, or other suitable conducting materials. The layer 250 is advantageously composed of doped polysilicon and may be deposited by CVD or other suitable techniques for forming polysilicon. The conductor layer 250 is doped with a dopant, such as phosphorus, by in situ diffusion or by ion implantation subsequent to deposition of the polysilicon, in a sufficient concentration to render the layer 250 conductive. The required doping level will depend upon the resistivity requirements for the buried local interconnect. In an exemplary embodiment, the dopant concentration for phosphorus is about $10^{19}$ atoms/cm$^3$. The layer 250 may be about 250 to 1000 Å thick and is advantageously about 600 Å thick.

Figure 6:
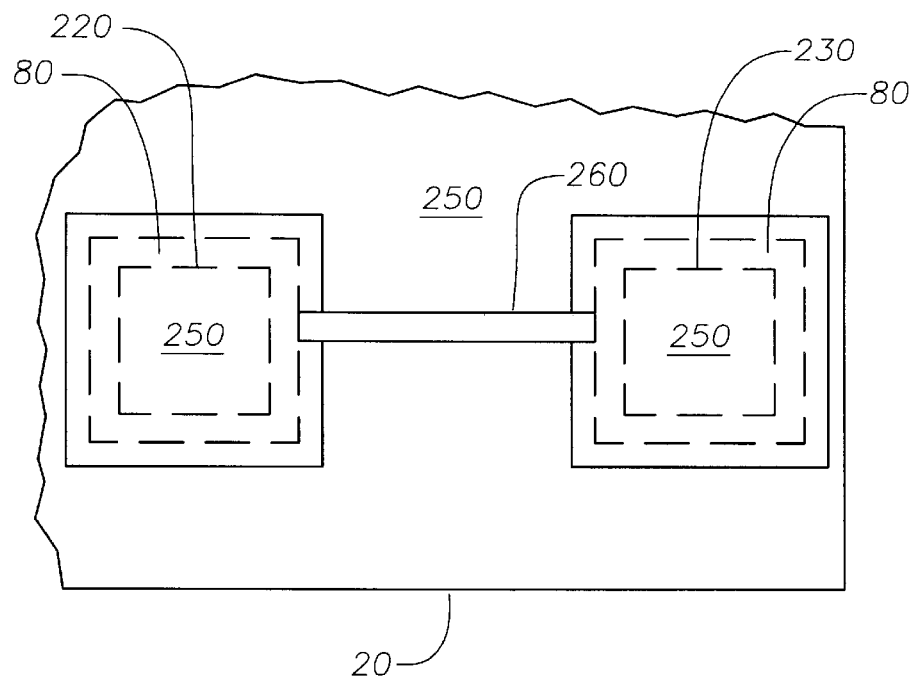
FIG. 6 is a plan view of the substrate depicted in FIG. 5 following application of a mask over the conductor layer and patterning of the mask into the layout of the buried local interconnect in accordance with the present invention.
Figure 7:
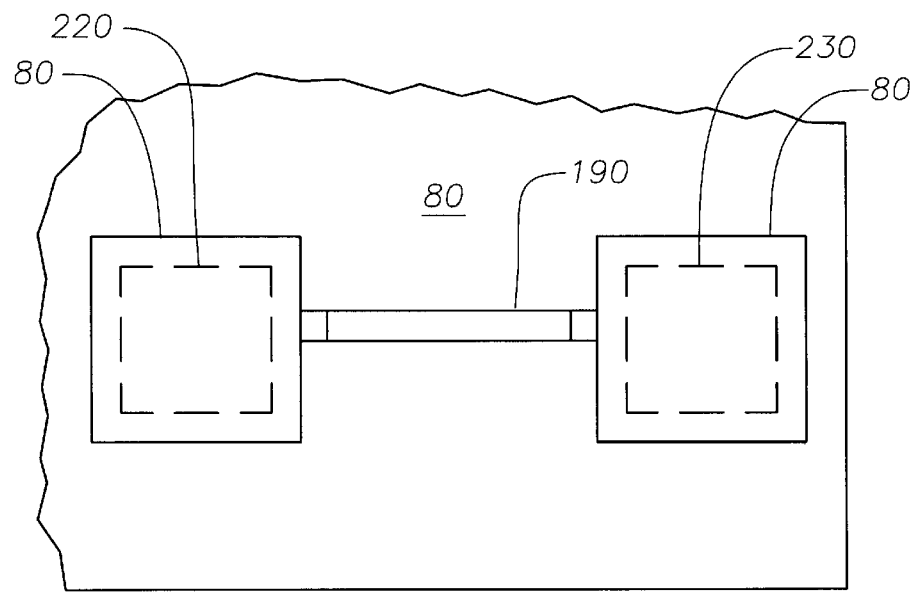
FIG. 7 is a plan view like FIG. 6 depicting the defined local interconnect layer in accordance with the present invention.

FIGS. 6 and 7 are plan views of the substrate 20 following the processing depicted up through FIG. 5. The active areas 220 and 230 are shown in phantom as well as the outline of the portions of layer 80 that surround the sidewalls of the active areas 220 and 230. A portion of the conductor layer 250 is removed to define the buried local interconnect 190. The conductor layer 250 is masked with photoresist or other suitable masking material and the mask is patterned to leave a portion of photoresist 260 corresponding to the layout of the buried local interconnect 190. The unmasked portion of the conductor layer 250 is then removed by reactive ion etching, plasma etching, or other suitable anisotropic etching techniques and the photoresist 260 is stripped to leave the defined buried local interconnect 190 as shown in FIG. 7. Removal of the unmasked portions of the conductor layer 250 exposes the first insulating layer 80.

Figure 8:
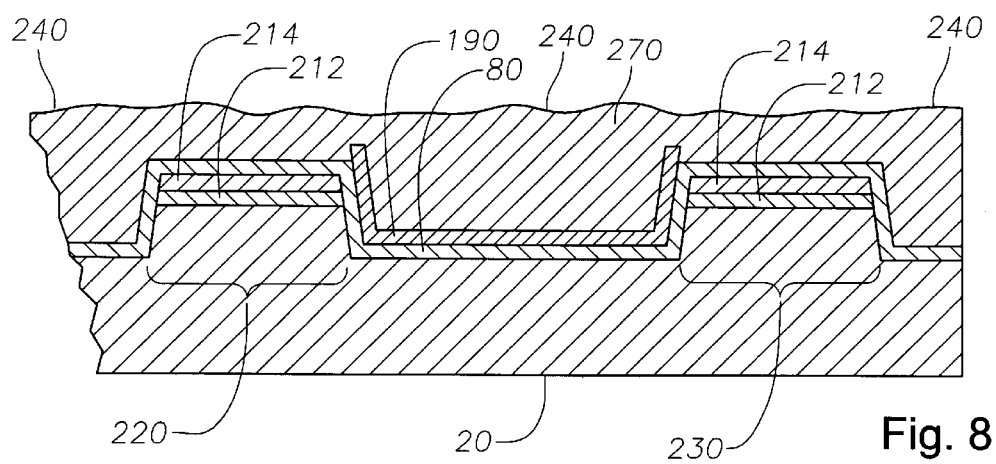
FIG. 8 is a cross-sectional view like FIG. 5 depicting formation of a second insulating layer over the buried local interconnect in accordance with the present invention.

Referring now to FIG. 8, a second insulating layer 270 is formed in the trench 240, covering the buried local interconnect 190. Through subsequent processing, the second insulating layer 270 will be transformed into the STI structures 100 shown in FIGS. 1 and 2. Accordingly, the second insulating layer 270 is advantageously composed of silicon dioxide, TEOS or other suitable trench isolation materials.

The second insulating layer 270 is advantageously applied by CVD and a reflow step may be performed as desired. The layer 270 may be about 1.0 to 1.5 μm thick and is advantageously about 1.0 μm thick.

Figure 9:
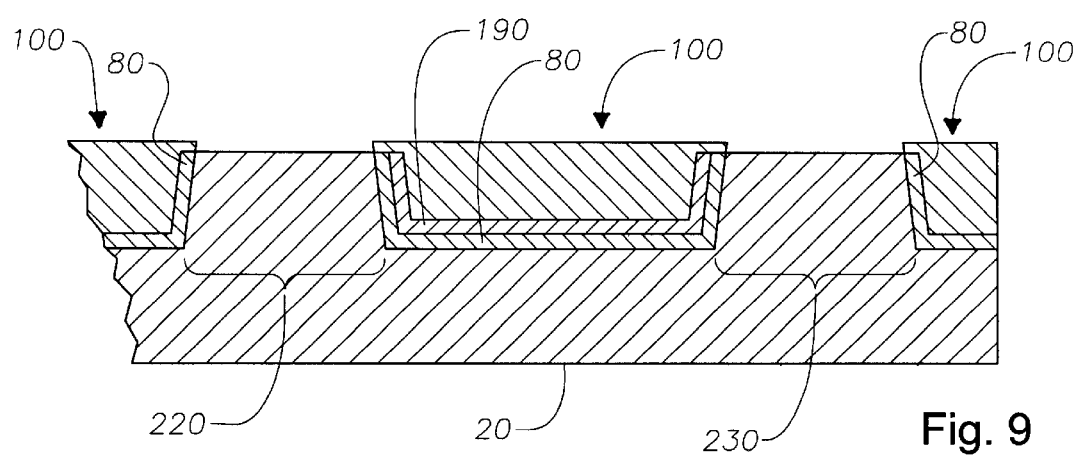
FIG. 9 is a cross-sectional view like FIG. 8 depicting planarization of the second insulating layer in accordance with the present invention.

Referring now to FIG. 9, the second insulating layer 270 and the portions of the layer 80 overlying the active areas 220 and 230 are planarized back to the nitride layers 214 by chemical-mechanical-polishing ("CMP") or other suitable planarization technique. The nitride layer 214 is etched away, and, if desired, the pad oxide layer 212 may also be etched away. Prior to etching the silicon nitride and pad oxide layers 214 and 212, the substrate is reverse masked so that only the silicon nitride layer and pad oxide layer 214 and 212 are exposed to the etches. The etch mask is then stripped.

Referring again to FIG. 2, the transistors 60 and 70 are formed. Initially, the gate dielectric layers 110 and 150 are formed on the substrate 20. The layers 110 and 150 may be silicon dioxide or other suitable gate dielectric material, and may be formed by thermal oxidation or CVD. The gate electrodes 120 and 160 may be formed by depositing a conductor material, such as polysilicon, by CVD. The gate dielectric layers 110 and 150 and the electrodes 120 and 160 are then patterned and anisotropically etched to the desired shapes. The source/drain regions 130, 140, 170, and 180 may then be formed by ion implantation or diffusion as desired. The dosage and energy for the implants is largely a matter of design discretion and will depend upon the dopant type selected. The source/drain regions 130, 140, 170, and 180 may be formed through a double implant process, where lightly doped drain structures are initially established.

To establish interconnection between the buried local interconnect 190 and the source/drain regions 140 and 50, vias may be established in the STI structure 100 to expose the vertically projecting portions of the buried local interconnect 190. If the vertically projecting portions are already exposed following planarization, via formation will not be necessary. The local interconnect straps 200 and 210 may then be formed over the vias to interconnect the source/drain regions 140 and 150 to the buried local interconnect 190. The straps 200 and 210 are advantageously composed of a conducting material, such as, aluminum, tungsten, or like materials, and may be applied by sputter deposition or similar techniques. A masking step is used to pattern the straps 200 and 210.

Figure 10:
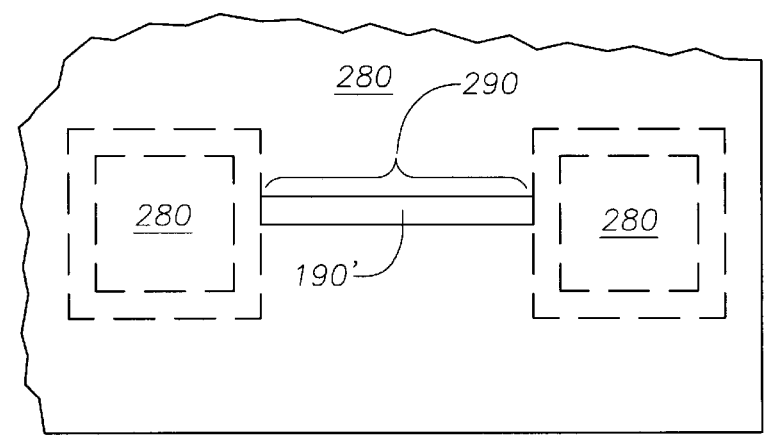
FIG. 10 is a plan view like FIG. 6 depicting an alternate exemplary process for masking and defining the buried local interconnect in accordance with the present invention.

An alternate embodiment of the process flow in accordance with the present invention may be understood by referring now to FIGS. 4 and 10. In this embodiment, the buried local interconnect, now designated 190', is defined in a damascene process in which the first insulating layer 80 is coated with a mask 280 that is lithographically patterned and etched to form a trench 290 in which conducting material for the buried local interconnect 190' may be deposited by CVD or like processes. FIG. 10 is a plan view of the substrate 20 following application of the mask 280 and patterning and etching of the mask 280 to define the trench 290. The trench 290 corresponds to the desired layout for the buried local interconnect 190'. Conducting material will be deposited into the trench 290 to establish the buried local interconnect 190'. The material selected for the mask 280 must be able to withstand the temperatures associated with the CVD process for depositing conducting material into the trench 290. In this regard the mask 280 may be advantageously composed of silicon dioxide that may be applied over the layer 80 by CVD or thermal oxidation. The mask 280 may then be masked and anisotropically etched by reactive ion etching, plasma etching, or other suitable anisotropic etching techniques to establish the trench 290. The buried local interconnect 190' may then be formed in the trench 290 by CVD and the mask 280 removed by a blanket etch of the substrate 20. Following definition of the local interconnect 190', the process flow described above in conjunction with FIGS. 8 and 9 may be followed.

The process of the present invention provides for placement of local interconnect layers at or beneath the silicon-silicon dioxide interface, and in the relatively uncluttered STI regions between active areas of an integrated circuit. Valuable chip area above the silicon-silicon dioxide interface, that would otherwise be taken up by local interconnect layers in conventional processing, may now be used for other purposes. For example, the vacated areas above the interface may be used to incorporate additional circuit components. Similarly, metallization layout flexibility may be enhanced. Since the process is integrated with STI trench formation, separate substrate etching is unnecessary.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents and alternatives falling within the spirit and scope of the invention as defined by the following appended claims.

What is claimed is:

1. A method of fabricating a buried local interconnect on a substrate, comprising the steps of:

forming a trench between first and second active regions in the substrate, the trench having a bottom wall and opposing sidewalls;

forming a first insulating layer over the trench and the first and second active regions;

forming a conductor layer over the first insulating layer;

removing respective portions of the conductor layer on the first insulating layer from over the first and second active regions to define a local interconnect layer while leaving the first insulating layer covering the bottom wall, whereby first and second portions of the first insulating layer on the bottom wall are exposed; and after defining the local interconnect layer, forming a second insulating layer in the trench covering the local interconnect layer.

2. The method of claim 1, wherein the step of removing a portion of the conductor layer comprises applying a mask to the conductor layer, patterning the mask to define the layout of the local interconnect layer, and etching the unmasked portions of the conductor layer.

3. The method of claim 1, comprising the step of planarizing the second insulating layer substantially to the uppermost portion of the substrate.

4. The method of claim 1, comprising the step of etching the second insulating layer to expose a portion of the local interconnect layer.

5. The method of claim 4, comprising the step of forming a conductor strap on the substrate and in contact with the exposed portion of the local interconnect layer.

6. The method of claim 1, wherein the conductor layer comprises doped polysilicon and the second insulating layer comprises silicon dioxide.

7. The method of claim 1, comprising the step of etching first and second portions of the second insulating layer overlying the local interconnect layer to expose first and second portions of the local interconnect layer.

8. The method of claim 7, wherein the first portion of the local interconnect layer is proximate a first sidewall of the trench and the second portion of the local interconnect layer is proximate a second sidewall of the trench.

9. The method of claim 8, comprising the step of forming a conductor strap on the substrate and in contact with one of the first and second exposed portions of the local interconnect layer.

10. The method of claim 1, wherein the conductor layer comprises doped polysilicon and the second insulating layer comprises TEOS.

11. A method of fabricating a buried local interconnect on a substrate, comprising the steps of:

forming a trench in the substrate, the trench having a bottom wall and opposing sidewalls;

forming a first insulating layer in the trench;

applying a mask to the first insulating layer;

patterning the mask to expose a portion of the first insulating layer;

forming a conductor layer to define a local interconnect layer on the exposed portion of the first insulating layer;

removing the mask to expose first and second portions of the first insulating layer on the bottom wall; and forming a second insulating layer in the trench covering the conductor layer.

12. The method of claim 11, comprising the step of etching the second insulating layer to expose a portion of the local interconnect layer.

13. The method of claim 9, comprising the step of planarizing the second insulating layer substantially to the uppermost portion of the substrate.

14. The method of claim 13, comprising the step of forming a conductor strap on the substrate and in contact with the exposed portion of the local interconnect layer.

15. The method of claim 11, wherein the conductor layer comprises doped polysilicon and the second insulating layer comprises silicon dioxide.

* * * * *

UNITED STATES PATENT AND TRADEMARK OFFICE
CERTIFICATE OF CORRECTION

PATENT NO. : 6,261,908 B1
DATED : July 17, 2001
INVENTOR(S) : Frederick N. Hause et al.

It is certified that error appears in the above-identified patent and that said Letters Patent is hereby corrected as shown below:

Column 1,
Line 11, delete "modem" and substitute -- modern -- therefor;
Line 21, delete "modem" and substitute -- modern -- therefor;
Line 32, delete "tetrathyl" and substitute -- tetra-ethyl -- therefor;
Line 41, delete "modem" and substitute -- modern -- therefor; and Claim 13,
Delete "9" and substitute -- 12 -- therefor.

Signed and Sealed this

Sixteenth Day of April, 2002

Attest:

JAMES E. ROGAN
Attesting Officer    Director of the United States Patent and Trademark Office